(12) United States Patent
Wang et al.

(10) Patent No.: US 11,088,258 B2
(45) Date of Patent: Aug. 10, 2021

(54) METHOD OF FORMING MULTIPLE-VT FETS FOR CMOS CIRCUIT APPLICATIONS

(71) Applicant: Samsung Electronics Co., Ltd., Suwon-si (KR)

(72) Inventors: Wei-E Wang, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/802,381

(22) Filed: Feb. 26, 2020

(65) Prior Publication Data
US 2020/0194569 A1 Jun. 18, 2020

Related U.S. Application Data

(63) Continuation-in-part of application No. 15/898,421, filed on Feb. 16, 2018, now Pat. No. 10,770,353.
(Continued)

(51) Int. Cl.
*H01L 29/51* (2006.01)
*H01L 21/8238* (2006.01)
(Continued)

(52) U.S. Cl.
CPC ...... *H01L 29/516* (2013.01); *H01L 21/28088* (2013.01); *H01L 21/28158* (2013.01); *H01L 21/823807* (2013.01); *H01L 21/823842* (2013.01); *H01L 21/823857* (2013.01); *H01L 27/0922* (2013.01); *H01L 29/045* (2013.01); *H01L 29/0649* (2013.01); *H01L 29/0673* (2013.01); *H01L 29/161* (2013.01);
(Continued)

(58) Field of Classification Search
CPC . H01L 29/516; H01L 29/045; H01L 29/0649; H01L 29/0673; H01L 29/161; H01L 29/42392; H01L 29/4908; H01L 27/0922
See application file for complete search history.

(56) References Cited

U.S. PATENT DOCUMENTS 7,718,496 B2 5/2010 Frank et al.
8,187,961 B2 5/2012 Doris et al.
(Continued)

OTHER PUBLICATIONS

C. Ren et al., "Work Function Tuning and Material Characteristics of Lanthanide-Incorporated Metal Nitride Gate Electrodes for NMOS Device Applications," IEEE Trans. Electron Devices, vol. 53, No. 8, pp. 1877-1884, Aug. 2006.
(Continued)

*Primary Examiner* — Christine A Enad
(74) *Attorney, Agent, or Firm* — Lewis Roca Rothgerber Christie LLP

(57) ABSTRACT

A field-effect transistor (FET) device having a modulated threshold voltage (Vt) includes a source electrode, a drain electrode, a channel region extending between the source electrode and the drain electrode, and a gate stack on the channel region. The gate stack includes an ultrathin dielectric dipole layer on the channel region configured to shift the modulated Vt in a first direction, a high-k (HK) insulating layer on the ultrathin dielectric dipole layer, and a doped gate metal layer on the HK insulating layer configured to shift the modulated Vt in a second direction.

20 Claims, 6 Drawing Sheets

Related U.S. Application Data

(60) Provisional application No. 62/587,327, filed on Nov. 16, 2017, provisional application No. 62/927,477, filed on Oct. 29, 2019.

(51) Int. Cl.

| | |
|---|---|
| *H01L 29/04* | (2006.01) |
| *H01L 29/06* | (2006.01) |
| *H01L 29/161* | (2006.01) |
| *H01L 29/423* | (2006.01) |
| *H01L 29/49* | (2006.01) |
| *H01L 29/786* | (2006.01) |
| *H01L 21/28* | (2006.01) |
| *H01L 27/092* | (2006.01) |

(52) U.S. Cl.
CPC .... *H01L 29/42392* (2013.01); *H01L 29/4908* (2013.01); *H01L 29/4966* (2013.01); *H01L 29/513* (2013.01); *H01L 29/517* (2013.01); *H01L 29/78696* (2013.01)

(56) References Cited

U.S. PATENT DOCUMENTS

| | | | |
|---|---|---|---|
| 8,309,447 | B2 | 11/2012 | Cheng et al. |
| 8,530,974 | B2 | 9/2013 | Chen |
| 8,536,009 | B2 | 9/2013 | Javorka et al. |
| 8,658,518 | B1 | 2/2014 | Chang |
| 8,669,615 | B1 | 3/2014 | Chan |
| 8,987,126 | B2 | 3/2015 | Choi |
| 9,171,954 | B2 | 10/2015 | Cartier |
| 9,245,982 | B2 | 1/2016 | Wang |
| 9,337,109 | B2 | 5/2016 | Doornbos |
| 9,362,180 | B2 | 6/2016 | Lee |
| 9,406,678 | B2 | 8/2016 | Ji et al. |
| 9,418,899 | B1 | 8/2016 | Shen |
| 9,455,201 | B2 | 9/2016 | Joshi |
| 9,472,773 | B1 | 10/2016 | Rosenblatt |
| 9,484,359 | B2 | 11/2016 | Cheng |
| 9,613,870 | B2 | 4/2017 | Ando |
| 9,728,462 | B2 | 8/2017 | Fan |
| 9,748,354 | B2 | 8/2017 | Tang |
| 10,002,791 | B1 | 6/2018 | Bao et al. |
| 2010/0197128 | A1* | 8/2010 | Schaeffer ........ H01L 21/823807 438/591 |
| 2010/0264495 | A1* | 10/2010 | Mo ................... H01L 29/66651 257/369 |
| 2011/0227163 | A1 | 9/2011 | Wang |
| 2012/0129330 | A1 | 5/2012 | Kim |
| 2012/0184093 | A1* | 7/2012 | Chudzik ......... H01L 21/823857 438/585 |
| 2014/0187028 | A1 | 7/2014 | Ando et al. |
| 2015/0021698 | A1 | 1/2015 | Ando |
| 2015/0021699 | A1 | 1/2015 | Ando |
| 2015/0262887 | A1* | 9/2015 | Xu .................... H01L 21/02304 438/216 |
| 2015/0287725 | A1* | 10/2015 | Zang ............... H01L 21/823842 257/392 |
| 2016/0093535 | A1 | 3/2016 | Xu |
| 2017/0005175 | A1 | 1/2017 | Song |
| 2017/0110324 | A1 | 4/2017 | Tsai |
| 2019/0096669 | A1* | 3/2019 | Bi .......................... H01L 21/02 |
| 2019/0103414 | A1 | 4/2019 | Ramkumar |

OTHER PUBLICATIONS

D. Lee et al., "Effective work function engineering for a TiN/XO(X= La, Zr, Al)/SiO$_2$ stack structures," Appl. Phys. Lett., vol. 108, No. 21, pp. 212102-212102-5, May 2016.
H. Wakabayashi, Y. Saito, K. Takeuchi, T. Mogami, and T. Kunio, "A Dual-Metal Gate CMOS Technology Using Nitrogen-Concentration-Controlled TiNx Film," IEEE Trans. Electron Devices, vol. 48, No. 10, pp. 2363-2369, Oct. 2001.
J. Franco et al., "BTI Reliability Improvement Strategies in Low Thermal Budget Gate Stacks for 3D Sequential Integration," 2018 IEEE International Electron Devices Meeting (IEDM), 2018, pp. 34.2.1-34.2.4.
J. Franco et al., "Low Thermal Budget Dual-Dipole Gate Stacks Engineered for Sufficient BTI Reliability in Novel Integration Schemes," 2019 Electron Devices Technology and Manufacturing Conference (EDTM), 2019, pp. 215-217.
L. E. Stillwagon and G. N. Taylor, "Evaluation of Several Organic Materials as Planarizing Layers for Lithographic and Etchback Processing," Polymers in Microlithography, Chapter 15, American Chemical Society, vol. 412, 1989, pp. 252-265.
L. P. B. Lima, H. F. W. Dekkers, J. G. Lisoni, J. A. Diniz, S. Van Elshocht, and S. De Gendt, "Metal gate work function tuning by Al incorporation in TiN," J. Appl. Phys., vol. 115, No. 7, pp. 074504-5, Feb. 2014.
M. Togo et al., "Novel N/PFET Vt control by TiN Plasma Nitridation for Aggressive Gate Scaling," 2016 IEEE Symposium on VLSI Technology, 2016, pp. 1-2.
U. Kwon et al., "A Novel Low Resistance Gate Fill for Extreme Gate Length Scaling at 20nm and Beyond for Gate-Last High-k/ Metal Gate CMOS Technology," IEEE Conference Publication, pp. 29-30, 2012.
W. S. Hwang, D. S. H. Chan, and B. J. Cho, "Metal Carbides for Band-Edge Work Function Metal Gate CMOS Devices," IEEE Trans. Electron Devices, vol. 55, No. 9, pp. 2469-2474, Sep. 2008.
Y. Kamimuta et al., "Comprehensive Study of $V_{FB}$ Shift in High-k CMOS—Dipole Formation, Fermi-level Pinning and Oxygen Vacancy Effect -," 2007 IEEE International Electron Devices Meeting, 2007, pp. 341-344.
Y. Sugimoto, et al., "Effective work function modulation of TaN metal gate on HfO$_2$ after postmetallization annealing," Applied Physics Letters: vol. 91, No. 11., pp. 112105-112105-3, (2007).
R. Brown, N. M. Idris, J. R. Watling, and A. Asenov, "Impact of Metal Gate Granularity on Threshold Voltage Variability: A Full-Scale Three-Dimensional Statistical Simulation Study," IEEE Electron Device Lett, Nov. 2010.
A. Tarniowy, R. Mania, and M. Rekas, "The effect of themal treatment on the structure, optical and electrical properties of amorphous titanium nitride thin films," Thin Solid Films, vol. 311, No. 1-2, pp. 93-100, Dec. 1997.
C H. Lee et al., "Selective GeOx-scavenging from interfacial layer on Si1-xGex d1annel for high mobility Si/Si1-xGex CMOS appli-cation," VLSI 2016, pp. 1-2.
C.-H. Yu, M.-H. Han, H.-W. Cheng, Z.-C. Su, Y. Li, and H. Watanabe, "Statistical simulation of metal-gate workfunction fluctuation in high-k/metal-gate devices," SISPAD 2010, pp. 153-156.
D. Guo et al., "FINFET technology featuring high mobility SiGe channel for 10nm and beyond," VLSI 2016, pp. 1-2.
Franco et al., Reliability of High Mobility SiGe Channel MOSFETs for Future CMOS Applications, Springer Series in Advanced Microelectronics, vol. 47, 2014.
G. Rzepa et al., "Complete extraction of defect bands responsible for instabilities in n and pFinFETs," VLSI 2016, pp. 1-2.
Arimura et al., "Si-passivated Ge nMOS gate stack with low Dit and dipole-induced superior PBTI reliability using 3D-compatible ALD caps and high-pressure anneal," IEDM 2016, p. 33.4.1-33.4.4.
H. K. Liou, P. Mei, U. Gennser, and E. S. Yang, "Effects of Ge concentration on SiGe oxidation behavior," Appl. Phys. Lett., vol. 59, No. 10, pp. 1200-1202, Sep. 1991.
Hobbs, et al., "High-k metal-gate pmos finfet threshold voltage tuning with aluminum implantation," 1 AIP Conference Proceedings vol. 1496, Issue 1, 10.1063/1.4766484, Nov. 30, 2012.
Hobbs, et al., "Simple fillet gate doping technique for dipole engineered vt tuning and cet scaling," Published in: VLSI Technology Systems and Applications (VLSI-TSA), 2012 International Symposium on Date of Conference: Apr. 23-25, 2012, Jun. 2012 INSPEC Accession, IEEE, Jun. 4, 2012.
J. Franco et al., "Gate stack thermal stability and PBTI reliability challenges for 3D sequential integration: Demonstration of a suitable gate stack for top and bottom tier nMOS," IRPS 2017, p. 2B-3.1-28-3.5.

(56) References Cited

OTHER PUBLICATIONS

J. Franco et al., "SiGe Channel Technology: Superior Reliability Toward Ultrathin EOT Devices; Part I: NBTI," IEEE Trans. Electron Devices, vol. 60, No. 1, pp. 396-404, Jan. 2013.
J. Franco, B. Kaczer, and G. Groeseneken, Reliability of high mobility SiGe channel MOSFETs for future CMOS applications. Dordrecht Springer, 2014, Part 1.
J. Franco, B. Kaczer, and G. Groeseneken, Reliability of high mobility SiGe channel MOSFETs for future CMOS applications, Dordrecht Springer, 2014, Part 2.
J. Franco, B. Kaczer, and G. Groeseneken, Reliability of high mobility SiGe channel MOSFETs for future CMOS applications. Dordrecht: Springer, 2014, Part 3.
J. Kavalieros et al., "Tri-Gate Transistor Architecture with High-k Gate Dielectrics, Metal Gates and Strain Engineering," VLSI 2006, pp. 50-51.
J. Xiang et al., "Investigation of TiAlC by Atomic Layer Deposition as N Type Work Function Metal for FinFET," ECS J. Solid State Sci. Technol., vol. 4, No. 12, pp. P441-P444, 2015.
J-P. Colinge, Ed., FinFETs and other multi-gate transistors. New York, NY: Springer, 2008, Part 1.
J-P. Colinge, Ed., FinFETs and other multi-gate transistors. New York, NY: Springer, 2008, Part 2.
J-P. Colinge, Ed., FinFETs and other multi-gate transistors. New York, NY: Springer, 2008, Part 3.
J-P. Colinge, Ed., FinFETs and other multi-gate transistors. New York, NY: Springer, 2008, Part 4.
J-P. Colinge, Ed., FinFETs and other multi-gate transistors. New York, NY: Springer, 2008, Part 5.
J-P. Colinge, Ed., FinFETs and other multi-gate transistors. New York, NY: Springer, 2008, Part 6.
J-P. Colinge. Ed., FinFETs and other multi-gate transistors. New York, NY: Springer, 2008, Part 7.
Choi et al., "The effect of metal thickness, overlayer and high-k surface treatment on the effective work function of metal electrode," Proceedings of ESSDERC 2005, pp. 101-104.
K. Kita, L. Q. Zhu, T. Nishimura, K. Nagashio, and A. Toriumi, "(Invited) Formation of Dipole Layers at Oxide Interfaces in High-k Gate Stacks," in ECS Transactions, 2010, vol. 33, pp. 463-477.
K.-M. Liu and C.-K. Lee, "Investigation of the random dopant fluctuations in 20-nm bulk mosfets and silicon-on-Insulator FinFETs by Ion implantation Monte Carlo simulation," Nanoelectronics Conference (INEC), 2013 IEEE 5th International 2013, pp. 263-266.
L.-A. Ragnarsson et aL, "Zero-thickness multi work function solutions for N7 bulk FinFETs," VLSI 2016, pp. 1-2.
Li et al., Self-Decomposition of SiO2 due to Si-chemical Potential Increase in SiO2 between HfO2 and Substrate, IEEE 2015.

M D Giles et al., "High sigma measurement of random threshold voltage variation in 14nm Logic FinFET technology," Symposium on VLSI Technology 2015, pp. T150-T151.
M Kadoshima et al., "Effective-Work-Function Control by Varying the TiN Thickness in Poly-Si/TIN Gate Electrodes for Scaled High-k CMOSFETs," IEEE Electron Device LetL, vol. 30. No. 5, pp, 466-468, May 2009.
Q. Wang et al., "Influence of LaSiOx passivation interlayer on band alignment between PEALD-Al2O3 and 4H-SiC determined by X-ray photoelectron spectroscopy," Appl. Surf. Sci., vol. 428, pp. 1-6, Jan. 2018.
R. Chau, S. Datta, M. Doczy, B. Doyle, J. Kavalieros, and M. Metz, "High-k/Metal-Gate Stack and Its MOSFET Characteristics," IEEE Electron Device Lett., vol. 25, No. 6, pp. 408-410, Jun. 2004.
Ragnarsson et al., Ultra Low-EOT (5 A) Gate-First and Gate-Last High Performance CMOS Achieved by Gate-Electrode Optimization, IEEE, 2009.
T. Ando et al., "Understanding mobility mechanisms in extremely scaled HfO2 (EOT 0.42 nm) using remote interfacial layer scavenging technique and Vt-tuning dipoles with gate-first process," presented at the IEDM, 2009, pp. 1-4.
T. Ando, M. Copel, J. Bruley, M. M. Frank, H. Watanabe, and V. Narayanan, "Physical origins of mobility degradation in extremely scaled SiO2/HfO2 gate stacks with La and Al induced dipoles," Appl. Phys. Lett., vol 96, No. 13, p. 132904, Mar. 2010.
T. Matsukawa et al., "Suppressing Vt and Gm variability of FinFETs using amorphous metal gates for 14 nm and beyond," IEDM Symposium 2012, p. 8.2.1-8.2.4.
T. Nabatame, M. Kimura, H. Yamada, A. Ohi, T. Ohishi, and T. Chikyow, "(Invited) Mechanism of Vfb Shift in HfO2 Gate Stack by Al Diffusion from (TaC)1-xAix Gate Electrode," ECS Trans., vol. 45, No. 3, pp. 49-59, Apr. 2012.
Takashi Ando, Ultimate Scaling of High-k Gate Dielectrics: Higher-k or Interfacial Layer Scavenging?, Materials 2002, vol. 5, pp. 478-500, Mar. 14, 2012.
Yee-Chia Yeo, P. Ranade, Qiang Lu, R. Lin, Tsu-Jae King, and Chenming Hu, "Effects of high-k dielectrics on the workfunctions of metal and silicon gates," IEEE Electron Device Lett, 2001, pp. 49-50.
Yeo et al., Effects of High-k Gate Dielectric Materials on Metal and Silicon Gate Workfunctions, IEEE Electron Device Letters, vol. 23, No. 6, Jun. 2002, pp. 342-344.
Sioncke, S., et al., "First demonstration of ~3500 cm2/V-s electron mobility and sufficient BTI reliability (max Vov up to 0.6V) In0.53Ga0.47As nFET using an IL/LaSiOx/HfO2 gate stack," VLSI Symposium 2017, pp. T38-T39.
Weimer, Marc, et al., "Materials for and Performance of Multilayer Lithography Schemes," Advances in Resist Materials and Processing Technology XXIV, Proceedings of the SPIE, vol. 6519, article id. 65192S, Mar. 2007, 8 pages.

* cited by examiner

METHOD OF FORMING MULTIPLE-VT FETS FOR CMOS CIRCUIT APPLICATIONS

CROSS-REFERENCE TO RELATED APPLICATION

This application is a continuation-in-part of U.S. patent application Ser. No. 15/898,421, filed Feb. 16, 2018 and titled "Method of forming multi-threshold voltage devices using dipole-high dielectric constant combinations and devices so formed," which claims priority to U.S. Provisional Patent Application No. 62/587,327, filed Nov. 16, 2017 and titled "Method for Forming Multi-Vt Devices for CMOS Using a Pair of Dipole and High K Dielectrics", the entire content of each of which are incorporated herein by reference. The present application claims priority to and the benefit of U.S. Provisional Application No. 62/927,477, filed Oct. 29, 2019 in the U.S. Patent and Trademark Office, the entire content of which is incorporated herein by reference.

FIELD

The present disclosure relates generally to field-effect transistors and methods of manufacturing the same. For example, embodiments of the present disclosure relate to field-effect transistors having modified threshold voltages (Vt), CMOS circuits including the same, and methods of manufacturing the same.

BACKGROUND

Multi-Vt devices (e.g., devices including a plurality of transistors having a range of different threshold voltages (Vt)) are used to optimize power consumption and/or minimize computing delays in circuit applications. Field effect transistors (FETs) having lower Vts are able to switch relatively quickly, but are prone to higher power leakage. In contrast, FETs having higher Vts conserve power by reducing static power leakage, but exhibit higher switching delays. As such, multi-Vt devices using FETs with lower Vts on time-critical paths and FETs with higher Vts on non-time-critical paths may provide improved performance in terms of computing speed and power consumption. Accordingly, methods of manufacturing FET combinations with a range of Vts are desired.

Advances in semiconductor engineering have enabled a dramatic scaling (scale down) in device size. Architectures such as fin field effect transistors (finFETs), gate all around FETs (GAA-FETs) and replacement metal gate FETs (RMG-FETs) exist to address certain critical issues at scaled nodes, such as the short channel effect (SCE). However, such architectures do not specifically address issues in multi-Vt devices. Earlier used methods of modulating FET Vts are incompatible with newer, smaller FETs and their manufacturing methods, or do not provide Vt modulation on a suitable scale of control (e.g., to suitable values). Accordingly, new methods of producing FETs with modulated Vts that are compatible with developing nodes are desired.

SUMMARY

Aspects of example embodiments of the present disclose are directed toward a field-effect transistor having a threshold voltage (Vt) that is modulated or fine-tuned by combining a dipole layer with work function metal doping.

Additional aspects of example embodiments of the present disclosure are directed toward a device including a plurality of the above field-effect transistors, and a method of manufacturing the field-effect transistor.

One or more embodiments of the present disclosure provide a field-effect transistor (FET) device having a modulated threshold voltage (Vt), the FET device including: a source electrode; a drain electrode; a channel region extending between the source electrode and the drain electrode; and a gate stack on the channel region, the gate stack including: an ultrathin dielectric dipole layer on the channel region configured to shift the modulated Vt in a first direction; a high-k (HK) insulating layer on the ultrathin dielectric dipole layer; and a doped gate metal layer on the HK insulating layer configured to shift the modulated Vt in a second direction.

In some embodiments, the second direction may be opposite the first direction. In some embodiments, the second direction may be the same as the first direction.

In some embodiments, the ultrathin dielectric dipole layer may include at least one of $Lu_2O_3$, $LuSiO_x$, $Y_2O_3$, $MgO$, $MgSiO_x$, $YSiO_x$, $La_2O_3$, $LaSiO_x$, $BaO$, $BaSiO_x$, $SrO$, $SrSiO_x$, or a combination thereof. In some embodiments, the FET device may be an nFET device, and the first direction may be a downward voltage level direction. In some embodiments, the FET device may be a pFET device, and the first direction may be an upward voltage level direction.

In some embodiments, the ultrathin dielectric dipole layer may include at least one of $Al_2O_3$, $AlSiO_x$, $TiO_2$, $TiSiO_x$, $HfO_2$, $HfSiO_x$, $ZrO_2$, $ZrSiO_x$, $TaO_2$, $TaSiO_x$, $ScO$, $ScSiO_x$, or a combination thereof. In some embodiments, the FET device may be an nFET device, and the first direction may be an upward voltage level direction. In some embodiments, the FET device may be a pFET device, and the first direction may be a downward voltage level direction.

In some embodiments, the doped gate metal layer may include at least one of Al-doped TiN, Al-doped TaN, Zr-doped TiN, Zr-doped TaN, Hf-doped TiN, Hf-doped TaN, or a combination thereof. In some embodiments, the FET device may be an nFET device, and the first direction may be a downward voltage level direction. In some embodiments, the FET device may be a pFET device, and the first direction may be an upward voltage level direction.

In some embodiments, the doped gate metal layer may include at least one of Si-doped TiN, Si-doped TaN, LaO-doped TiN, LaO-doped TaN, SiO-doped TiN, SiO-doped TaN, ZrO-doped TiN, ZrO doped TaN, lanthanide metal-doped TiN, La-doped TaN, or a combination thereof. In some embodiments, the FET device may be an nFET device, and the first direction may be an upward voltage level direction. In some embodiments, the FET device may be a pFET device, and the first direction may be a downward voltage level direction.

In some embodiments, the doped gate metal layer may have a doping amount of greater than 0 atomic percent (at %) to 4 at %.

In some embodiments, the ultrathin dielectric dipole layer may have a thickness of less than 1 nm after annealing.

In some embodiments, the doped gate metal layer may have a thickness of 1 nm to 5 nm.

In some embodiments, the channel region may include silicon (Si), silicon-germanium (SiGe), or SiGe with an overlying layer of naturally formed $SiO_x$. In some embodiments, the channel region may be arranged on a silicon (Si), silicon on insulator (SOI), strain-SOI (sSOI), silicon-germanium on insulator (SGOI), or strain-SGOI (sSGOI) substrate; and the substrate and/or the channel region may have a crystal orientation of (110), (111), or (100).

In some embodiments, the channel region may include a plurality of nanosheets having a vertical spacing (VSP) therebetween of 5 nm to 15 nm, the nanosheets being interposed by an interfacial layer (IL) oxide and the gate stack.

One or more embodiments of the present disclosure provide a complementary metal-oxide-semiconductor (CMOS) circuit including a first FET device and a second FET device, where the first FET device and the second FET device are each the FET device according to embodiments of the present disclosure. The first FET device may be an nFET device and the second FET device may be a pFET device.

In some embodiments, the nFET device and the pFET device may each be independently selected from a high Vt (HVT) device, a regular Vt (RVT) device, a low Vt (LVT) device, and a super low Vt (SLVT) device, the HVT device and the RVT device being different in voltage by 50 mV to 100 mV, the RVT device and the LVT device being different in voltage by 50 mV to 100 mV, and the LVT device and the SLVT device being different in voltage by 50 mV to 100 mV. In some embodiments, the HVT device and the RVT device may be different in voltage by 60 mV to 80 mV, the RVT device and the LVT device may be different in voltage by 60 mV to 80 mV, and the LVT device and the SLVT device may be different in voltage by 60 mV to 80 mV.

One or more embodiments of the present disclosure provide a method of manufacturing a CMOS circuit, the method including: providing a first channel region between a first source electrode and a first drain electrode in a first area corresponding to a first FET device, providing a second channel region between a second source electrode and a second drain electrode in a second area corresponding to the second FET device; selectively depositing a first gate stack for the first FET device by: depositing a first organic planarization layer on the second channel region of the second FET device; depositing a first ultrathin dielectric dipole layer in the first and second areas; depositing a first high-k (HK) insulating layer in the first and second areas; depositing a first doped gate metal layer in the first and second areas; and utilizing lift-off to etch the first organic planarization layer, the first ultrathin dielectric dipole layer, the first high-k (HK) insulating layer, and the first doped gate metal layer in the second area; and selectively depositing a second gate stack for the second FET device by: depositing a second organic planarization layer on the first FET device; depositing a second ultrathin dielectric dipole layer in the first and second areas; depositing a second high-k (HK) insulating layer in the first and second areas; depositing a second doped gate metal layer in the first and second areas; and utilizing lift-off to etch the second organic planarization layer, the second ultrathin dielectric dipole layer, the second high-k (HK) insulating layer, and the second doped gate metal layer in the first area.

In some embodiments, the first ultrathin dielectric dipole and the second ultrathin dielectric dipole layer may each be deposited via atomic layer deposition (ALD) at a temperature of 100° C. to 500° C.

In some embodiments, the first doped gate metal layer and the second doped gate metal layer may each be deposited via atomic layer deposition (ALD) at a temperature of 100° C. to 500° C.

In some embodiments, the first doped gate metal layer and the second doped gate metal layer may each include doping amounts of 0 at % to 4 at %, the amounts being different from each other.

BRIEF DESCRIPTION OF THE DRAWINGS

These and other features and advantages of embodiments of the present disclosure will become more apparent by reference to the following detailed description when considered in conjunction with the following drawings.

DETAILED DESCRIPTION

Figure 1:
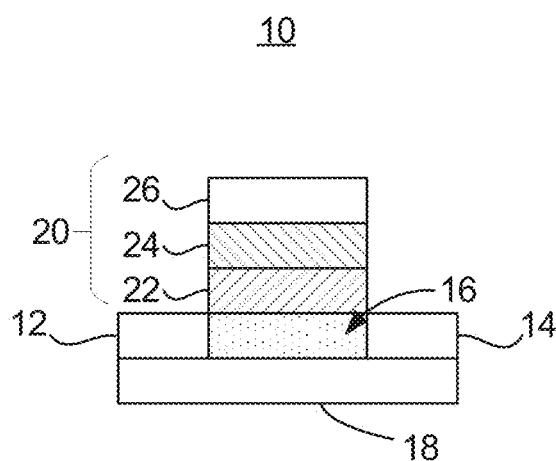
FIG. 1 is a schematic view of a FET device having a modulated threshold voltage (Vt) according to embodiments of the present disclosure.

Hereinafter, example embodiments will be described in more detail with reference to the accompanying drawings, in which like reference numbers refer to like elements throughout and duplicative descriptions may not be provided. The embodiments disclosed herein may be embodied in various different forms, and the present disclosure should not be construed as being limited to only the embodiments explicitly illustrated herein. Rather, these embodiments are provided as examples, and will convey certain aspects and features of embodiments to those skilled in the art. Detailed description of certain processes, elements, and techniques encompassed by the present disclosure may be omitted, as appropriate (e.g., for convenience).

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The terms "upward" and "downward" with respect to voltage level direction, including shifts in threshold voltage, may be understood as referring to a more positive voltage (level) and a more negative voltage (level), respectively.

Unless otherwise defined, all terms (including technical and scientific terms) used herein have the same meaning as commonly understood by one of ordinary skill in the art that pertains to the present disclosure. It will be further understood that terms, such as those defined in commonly used dictionaries, should be interpreted as having meanings that are consistent with their meanings in the context of the relevant art and/or the present specification, and should not be interpreted in an idealized or overly formal sense, unless expressly so defined herein.

Advances in scaling have enabled a dramatic increase in the arrangement density of metal oxide semiconductor field effect transistor (MOSFET) devices on a chip substrate in order to decrease the size of integrated circuits. However, such advances in scaling have also made it more difficult to provide multi-threshold voltage (mVt) devices for circuit applications, simply due to the smaller dimensions and lack of space.

Channel doping adjustment (e.g., doping of the FET channel layer) has been used to modulate threshold voltage (Vt) and to enable mVt devices at larger nodes. However, channel doping adjustment is subject to random dopant fluctuation (RDF), which may cause the doping level to vary across several transistors. While such variation can be within an acceptable range at larger nodes, the magnitude of dopant concentration variation and subsequent Vt change caused by RDF can be amplified at smaller nodes, which can have vastly decreased channel lengths. As such, the use of channel doping in certain advanced devices (e.g., smaller nodes) may be limited by unacceptably large variations in Vt.

Another method to enable mVt devices relies on integrating a reactive work function metal (WFM) (such Al, Ti, etc.) with an underlying mid-gap WFM (such as TaN, TiN, etc.) to form a WFM replacement metal gate (RMG). The Vt of such a device may be varied by selecting suitable or appropriate relative thicknesses of the two metals. For example, the utilization of a thicker mid-gap WFM layer may increase the effective work function (eWF), while the utilization of a thicker reactive metal layer may reduce the eWF. While this method can be suitable for RMG spacing on a 15 nm to 19 nm scale, its wider utility may be limited, for example as future nodes scale down to 3 nm and beyond. In such extreme scaled nodes, the available RMG space may be about 10 nm or even lower, for example, as in high performance p-doped FET (pFET) devices (e.g., super low Vt pFETs or SLVTp) that can include thick (almost 10 nm) n-type work function metal (nWFM) layers. Alternative methods for tuning Vt that are independent of the thickness of the WFM are therefore highly desired.

A variation of the above method involves replacing the mid-gap WFM (e.g., TiN) with an nWFM having a low eWF. Non-limiting examples of such nWFMs include metal carbides (such as TiAlC, TaC, CoAlC, and/or the like), and more reactive nitrides (such as TaN and/or plasma nitridated TiN). However, non-metallic constituents (such as carbon, oxygen, and/or nitrogen) are often highly unstable in the WFM, and may cause severe side effects due to their weak bonding within the layer. For example, the eWF of TiN can be modified by $N_2$ plasma, but resulting diffusion of free nitrogen into the high-k (HK) insulating layer may also cause a leakage (e.g., carrier leakage) increase, for example, on the order of $10^2$.

As understood by those having ordinary skill in the art, the relationship between eWF and Vt depends on the type or kind of device. For example, in an nFET (nMOS) device, an increase in eWF corresponds to an increase in Vt, while a decrease in eWF corresponds to a decrease in Vt. In a pFET (pMOS) device, an increase in eWF corresponds to a lower Vt, while a decrease in eWF corresponds to a higher Vt.

The Vt of nFET devices can be modulated, without changing the WFM thickness, by soaking the WFM layer with silane gas. Without being limited by the correctness of any theory or explanation, it is thought that such silane gas treatment shifts the Vt higher due to dipole formation at the interface between the HK insulating layer and the WFM (e.g., the HK/WFM interface). However, this method can only increase the eWF, and appears incapable of reducing the eWF of nFET devices. Further, the method does not appear to affect pFET devices. In addition, this silane method can be challenging to implement in a way that would allow a controlled Vt shift.

Another approach, utilized in the RMG process, is to incorporate a thin dielectric layer (such as $La_2O_3$ or $Al_2O_3$) in the gate stack by depositing an HK insulating layer, then depositing the dielectric layer. The dielectric layer can be subsequently driven through the HK insulating layer using a very high temperature (e.g., >1000° C.) anneal so as to form a Vt-modulating dipole layer at the interface between the HK insulating layer and the channel region. La—O dipoles generally do not impact device mobility; however, the high temperature drive-in anneal used to form this structure may severely increase the junction grading of the device. As such, this method may not be applicable to the smaller channel regions of extreme nodes.

A newer approach utilizes low temperature atomic layer deposition (ALD) to deposit an ultrathin (e.g., less than 2 nm thick, less than 0.5 nm thick, or 0.2 nm to 0.5 nm thick) dielectric dipole layer of $LaSiO_x$ (e.g., for lowering the eWF) or AlO (e.g., for increasing the eWF), prior to depositing the HK insulating layer. This method has been shown to be effective in shifting the Vts of silicon-complementary metal-oxide-semiconductor (Si-CMOS) devices without impacting device performance and reliability. The thickness used to implement such a layer may be at least one order of magnitude lower (few nm) than the thicknesses used to modulate Vt using the integrated reactive/mid-gap WFM method (~10 nm to 20 nm). Aspects of this method are described in U.S. Pat. No. 10,446,400, issued Oct. 15, 2019 and titled "Method of forming multi-threshold voltage devices and devices so formed," and in U.S. application Ser. No. 15/898,421, filed Feb. 16, 2018 and titled "Method of forming multi-threshold voltage devices using dipole-high dielectric constant combinations and devices so formed," the entire content of each of which is incorporated herein by reference.

However, the range of achievable Vt shifts using this method may be limited. For example, the dielectric strength of $LaSiO_x$ (k value=~8) is lower than the dielectric strength of the HK insulating layer material ($HfO_2$, k=~22). A thick $LaSiO_x$ layer may therefore be inappropriate, due to the negative impact it could have on the equivalent oxide thickness (EOT) of the device. On the other hand, the structure and thickness of the layer may need to be improved (e.g., optimized) to avoid negative impacts to mobility and other device performance parameters. Experimental results suggest that a layer thickness of 0.2 nm for the case of $LaSiO_x$ (and for AlO) may provide a 200 mV to 400 mV shift in Vt, with negligible impacts to EOT, reliability, and mobility.

However, the magnitude of this voltage shift (i.e., 200 mV to 400 mV) may, in some cases, be too large to be of practical use. For example, a desirable Vt difference between neighboring FETs (e.g., a high Vt (HVT) device, a regular Vt (RVT) device, a low Vt (LVT) device, and/or a super low Vt (SLVT) device) in a 3 Vt device may be around 60 mV to 75 mV between each category or type of FET device. Additional and/or alternative methods of shifting Vt are therefore desired to reduce and fine-tune Vt values and differences for use in mVt devices.

Aspects of example embodiments of the present disclosure provide a FET device having a controlled or modulated Vt, and a gate stack for the FET device that may be selected to modulate Vt. For example, the FET device and gate stack may be designed or manufactured to have a set or particular Vt, such that multiple FET devices, when combined on the same die, may have different Vts in order to form a multi-Vt device. The gate stack according to embodiments of the present disclosure may enable modulation of Vt via a dual variable system, thereby enabling concurrent (e.g., simultaneous) gross and fine—(e.g., precise) tuning of the desired Vt value. Further, the Vt modulating structures within the gate stack according to embodiments of the present disclosure may offer such capabilities within a WFM scale of several angstroms (e.g., provide angstrom control). Accordingly, example embodiments of the present disclosure may provide a WFM capable of meeting stringent future RMG spacing specifications of less than 10 nm.

A field-effect transistor (FET) device having a modulated threshold voltage (Vt) includes: a source electrode; a drain electrode; and a channel region extending between the source electrode and the drain electrode. A gate stack on the channel region includes: an ultrathin dielectric dipole layer on the channel region; a high-k (HK) insulating layer on the ultrathin dielectric dipole layer; and a doped gate metal layer on the HK insulating layer.

As used herein, the term "doped gate metal layer" may be interchangeably used with the term "doped WFM." For example, the structures and functions implied by the two terms may be analogous or substantially the same.

The FET device may be an n-doped FET (nFET) device or a p-doped FET (pFET) device, and (e.g., the channel region of the FET device) may include or be formed of an intrinsic or doped semiconductor material, without limitation. Further, although embodiments of the present disclosure provide strong advantages in uniquely enabling multi-Vt in extreme scaled nodes, the FET device may be of any suitable node or size.

The ultrathin dielectric dipole layer may shift the modulated Vt in a first direction and in a first magnitude. Simultaneously or concurrently, the doped gate metal layer may independently shift the modulated Vt in a second direction and/or in a second magnitude. Thus, the Vt of the device may be adjusted to selected or designated values (large or small) in an effective and controllable manner when the two shifts are applied together.

The degree or magnitude of the modulation (shift) by the ultrathin dielectric dipole layer may be larger than that of the doped gate metal layer. The first direction, the second direction, and the magnitudes of each shift may be selected to yield a desired Vt value. Such shifts may be determined by the type of device, compositions of various layers, and/or optimization of layer parameters and/or layer formation parameters, as will be discussed in more detail below.

In some embodiments, the second direction may be opposite the first direction, and the shift provided by the doped gate metal layer may counterweight the shift provided by the ultrathin dielectric dipole layer. For example, the second direction may be a downward voltage level direction while the first direction is an upward voltage level direction, or the second direction may be an upward voltage level direction while the first direction is a downward voltage level direction.

In some embodiments, the second direction may be the same as the first direction, and the shift provided by the doped gate metal layer may augment the shift provided by the ultrathin dielectric dipole layer. For example, the first and second directions may both be downward voltage level directions, or the first and second directions may both be upward voltage level directions.

FIG. 1 is a schematic view of the FET device having a modulated threshold voltage (Vt) according to embodiments of the present disclosure. The FET device 10 includes the source electrode 12, the drain electrode 14, and the channel region 16 on a substrate 18. The gate stack 20 on the channel region 16 includes the ultrathin dielectric dipole layer 22, the HK insulating layer 24, and the doped gate metal layer 26 in the above-described order. The details of each element will be described in more detail below.

The ultrathin dielectric dipole layer may be deposited below (before) the HK insulating layer and on the channel region. In some embodiments, for example, the ultrathin dielectric dipole layer is deposited below (before) the HK insulating layer, and the HK insulating layer is deposited after and on the ultrathin dielectric dipole layer. In some embodiments, the ultrathin dielectric dipole layer may be deposited on an interfacial or natural oxide layer, such as $SiO_2$, that is formed on the channel region. The ultrathin dielectric dipole layer may include a metal oxide capable of forming a dipole with the HK insulating layer. In some embodiments, the metal oxide may be a silicate material (e.g., a compound including one or more metal ions and an $SiO_x$ group).

In some embodiments, the ultrathin dielectric dipole layer may include or be formed of at least one of $Lu_2O_3$, $LuSiO_x$, $Y_2O_3$, MgO, $MgSiO_x$, $YSiO_x$, $La_2O_3$, $LaSiO_x$, BaO, $BaSiO_x$, SrO, $SrSiO_x$, or a combination thereof. As used herein, "$O_x$" indicates an oxide with varying stoichiometry. When the FET device is an nFET device, the first direction may be a downward voltage level direction, and when the FET device is a pFET device, the first direction may be an upward voltage level direction.

In some embodiments, the ultrathin dielectric dipole layer may include or be formed of at least one of $Al_2O_3$, $AlSiO_x$, $TiO_2$, $TiSiO_x$, $HfO_2$, $HfSiO_x$, $ZrO_2$, $ZrSiO_x$, $TaO_2$, $TaSiO_x$, ScO, $ScSiO_x$, or a combination thereof. When the FET device is an nFET device, the first direction may be an upward voltage level direction, and when the FET device is a pFET device, the first direction may be a downward voltage level direction.

The thickness of the ultrathin dielectric dipole layer may be optimized or selected according to the desired gross Vt shift (e.g., first magnitude). The gross Vt shift may be, for example, a value of 200 mV to 400 mV depending on the particular deposition parameters used to form the layer. In some embodiments, the ultrathin dielectric dipole layer may have a thickness after annealing of less than 2 nm, for example, 0.1 nm to 2 nm. In some embodiments, the thickness may be less than 1 nm, for example, 0.1 nm to 1 nm, 0.1 nm to 0.5 nm, or 0.2 nm to 0.5 nm thick. When the thickness of the ultrathin dielectric dipole layer is within the above-described ranges, the impact to the overall EOT of the device may be minimized or reduced.

The HK dielectric layer may be deposited on (after) the ultrathin dielectric dipole layer. The HK dielectric layer may include or be formed of any material suitable for FET devices and having a dielectric constant greater than that of $SiO_2$ (e.g., a dielectric material other than $SiO_2$ and/or having a dielectric constant greater than 4.2, or greater than or equal to about 20-25), thereby providing a sufficiently high EOT to prevent or reduce leakage without requiring a large layer thickness. As discussed above, the HK dielectric layer may form a dipole with the underlying ultrathin dielectric dipole layer. In some embodiments, the HK dielectric layer may include or be formed of $HfO_2$, $ZrO_2$, $HfSiO_x$, $HfZrO_x$, and $ZrAlO_x$, and combinations thereof. The combined thickness of the ultrathin dielectric dipole layer and the HK dielectric layer may be less than 3 nm, and in some embodiments may be less than 2 nanometers. The order of depositing these layers may be referred to as "dipole-before HK."

The doped gate metal layer may be deposited on (e.g., formed after) the HK dielectric layer. In some embodiments, the doped gate metal layer may be directly on the HK dielectric layer, and in some embodiments, may be on a natural oxide layer above the HK dielectric layer. The doped gate metal layer may include or be formed of a WFM that is doped with a metallic element or a compound of the metallic element that can be stable within the WFM matrix (e.g., in contrast to the carbon, nitrogen, and oxygen atoms as discussed above), for example, as long as the gate metal layer is not subjected to a high temperature anneal. In some embodiments, the WFM may be a mid-gap WFM (such as TaN, TaC, TiC and/or TiN); however, embodiments of the present disclosure are not limited thereto. In some embodiments, the metallic element may be aluminum (Al), silicon (Si), hafnium (Hf), zirconium (Zr), or a lanthanide metal (such as lanthanum (La), cerium (Ce), or ytterbium (Yb)). In some embodiments, the compound of the metallic element may be an oxide compound of any of the above metals. For example, the compound may be a $LaO_x$ compound, an $AlO_x$ compound, a ZrO compound, and/or the like.

In general, when the WFM of the gate metal layer is doped with a more reactive element or material (such as La, Hf, Al, or Zr, etc.), the eWF of the layer may be lowered, with corresponding results for Vt. For example, the doping material may be an n-metal with respect to the host. This is consistent with observations of FETs in the art using TiAlC as an nWFM, which is understood to have a lowered eWF due to the presence of Al. In contrast, when the WFM of the gate metal layer is doped with a less reactive material (such as Si, LaO, SiO, ZrO, etc.), the eWF of the layer may be increased, resulting in a corresponding shift of relevant Vt.

Without being bound by the correctness of any theory or explanation, it is thought that the dopant may change the oxygen potential of the matrix material of the doped metal gate layer. The change in oxygen potential may change the concentration of various valence states within the metal gate layer, thereby changing the eWF.

In some embodiments, the doped gate metal layer may include or be formed of at least one of Al-doped TiN, Al-doped TaN, Zr-doped TiN, Zr-doped TaN, Hf-doped TiN, Hf-doped TaN, or a combination thereof. When the FET device is an nFET device, the first direction may be a downward voltage level direction, and when the FET device is a pFET device, the first direction may be an upward voltage level direction.

In some embodiments, the doped gate metal layer may include or be formed of at least one of Si-doped TiN, Si-doped TaN, LaO-doped TiN, LaO-doped TaN, SiO-doped TiN, SiO-doped TaN, ZrO-doped TiN, ZrO doped TaN, lanthanide metal-doped TiN, La-doped TaN, or a combination thereof. When the FET device is an nFET device, the first direction may be an upward voltage level direction, and when the FET device is a pFET device, the first direction may be a downward voltage level direction.

In some embodiments, the doped gate metal layer may have a doping amount of greater than 0 atomic percent (at %) to 4 at %, for example, 0.1 at % to 3 at %, 0.2 at % to 2 at %, or 0.5 at % to 1 at %. However, embodiments of the present disclosure are not limited thereto, and the doping amount may be optimized or selected according to the desired Vt shift of the device and the stability of the dopant in the gate metal layer matrix. In some embodiments, the effect of the dopant concentration on Vt may be substantially linear.

In some embodiments, the doped gate metal layer may be formed in a single deposition as a substantially continuous single layer using optimized atomic layer deposition (ALD), and without needing to be annealed at high temperature (e.g., temperatures above 500° C.).

When the above-described doped gate metal layer according to embodiments of the present disclosure is incorporated into the gate stack of the FET device, suitable Vt shift values may be obtained without a large increase in the thickness of the layer, as well as the overall gate stack. In some embodiments, the doped gate metal layer may have a thickness of 1 nm to 5 nm, for example, 1 nm to 3 nm.

In some embodiments, the channel region underlying the gate stack according to embodiments of the present disclosure may include or be formed of silicon (Si), silicon-germanium (SiGe), or SiGe with an overlying layer of naturally formed $SiO_x$. In some embodiments, the channel region may be arranged on a silicon (Si), silicon on insulator (SOI), strain-silicon on insulator (sSOI), silicon-germanium on insulator (SGOI), or strain-silicon-germanium on insulator (sSGOI) substrate. The substrate and/or the channel region may have a crystal orientation of (110), (111), (100), and/or the like.

The source electrode, drain electrode, and channel region may otherwise be the same as understood by those having ordinary skill in the art, and such aspects will not be described in further detail.

In some embodiments, the layers of the gate stack (including the ultrathin dielectric dipole layer, the high-k (HK) insulating layer, and the doped gate metal layer) may each be substantially amorphous. However, embodiments of the present disclosure are not limited thereto, and in some embodiments, one or more layers may be crystalline, for example, polycrystalline or single-crystalline.

It will be understood that embodiments of the present disclosure, for example the combination and order of layers in the gate stack, may be applied to any suitable FET device, design, or geometry, as accomplished by those having ordinary skill in the art. In some embodiments, the FET device may be a FinFET device or a gate-all-around (GAA) nanosheet FET device. In some embodiments, for example, the channel region may include a plurality of nanosheets separated by a vertical spacing (VSP) there between, where the nanosheets are interposed by (or, e.g., surrounded by) an interfacial layer (IL) oxide and the above-described gate stack, including the ultrathin dielectric dipole layer on the channel region; the high-k (HK) insulating layer on the ultrathin dielectric dipole layer; and the doped gate metal layer. The VSP may be 5 nm to 15 nm, and in some embodiments 6 nm to 12 nm, for example, 7 nm to 9 nm.

In some embodiments, other combinations and order of layers in the gate stack may be possible, for example, as modifications or re-orderings of the above. In some embodiments, the gate stack may include one or more additional layers or interlayers between those described above. In some embodiments, for example, an interlayer may be formed between two adjacent described layers due to diffusion and/or mixing of the layers, or for example due to reaction with oxygen (thus forming a natural oxide) and/or other ambient gases between deposition of subsequent layers.

Aspects of example embodiments of the present disclosure provide a CMOS circuit comprising at least a first FET device and a second FET device. The first FET device and the second FET device may each be (e.g., have the same structure and composition as) the above-described FET device according to embodiments of the present disclosure. The first FET device may be an nFET device and the second FET device may be a pFET device, or vice versa.

Each device may independently be a high Vt (HVT) device, a regular Vt (RVT) device, a low Vt (LVT) device, or a super low Vt (SLVT) device. The Vt values of the HVT device, the RVT device, the LVT device, and the SLVT device may each be defined in relation to each other. Qualitatively, the voltages of each may descend down the list, with the HVT device having the highest Vt and the SLVT having the lowest Vt. Each of the HVT device, the RVT device, the LVT device, and the SLVT device may be separated by a voltage gap. For example, the HVT device may be higher in voltage than the RVT device by the voltage gap, the RVT device may be higher in voltage than the LVT device by the voltage gap, and so on.

The voltage gap (separation) between each pair of devices may be independently selected to be 60 mV to 150 mV, for example, 60 mV to 100 mV, or 60 mV to 75 mV. In some embodiments, for example, the HVT device and the RVT device may be different in voltage by 50 mV to 100 mV, the RVT device and the LVT device may be different in voltage by 50 mV to 100 mV, and the LVT device and the SLVT device may be different in voltage by 50 mV to 100 mV. In some embodiments, the HVT device and the RVT device may be different in voltage by 60 mV to 80 mV, the RVT device and the LVT device may be different in voltage by 60 mV to 80 mV, and the LVT device and the SLVT device may be different in voltage by 60 mV to 80 mV.

In some embodiments, the first FET device and the second FET device may be selected from adjacent-Vt devices. For example, the first FET device may be a HVT device and the second FET device may be a RVT device, etc. In some embodiments, the first FET device and the second FET device may be selected from non-adjacent-Vt devices. For example, the first FET device may be a HVT device and the second FET device may be a SLVT device, etc. In this case, the effective (e.g., cumulative) voltage gap between the two devices may be larger, for example, 100 mV to 280 mV.

As an alternative, the terms HVT, RVT, LVT, and SLVT may merely be used to express the relative voltages between two or more FET devices, and a numerical ordering of those voltages may be mapped to the terms in a manner consistent with the conventional meanings of "high," "regular," "low," and "superlow," etc. (e.g., from the largest absolute value to the smaller absolute value).

While embodiments herein have been described with respect to a CMOS circuit, it will be understood that the FET devices described herein may be suitably utilized in other types of circuits. Similarly, although a circuit including two FET devices according to embodiments of the present disclosure has been described, those having ordinary skill in the art are capable of extrapolating the principles herein to multi-Vt circuits and devices having any number of FET devices, as deemed suitable.

Aspects of example embodiments of the present disclosure provide a method of manufacturing a CMOS circuit including two or more FET devices having a modulated Vt, according to embodiments of the present disclosure. The gate stack prepared using this method can be applied to an extreme case of minimum RMG spacing of 8 nm, which may include a ~2 nm thickness of the ultrathin dielectric dipole layer/HK insulating layer pair and a 2 nm thickness of the doped gate metal layer. In general, the process acts or steps according to example embodiments of the present disclosure can be expected to meet RMG spacing <10 nm.

The method includes: providing a first channel region between a first source electrode and a first drain electrode in a first area corresponding to a first FET device, providing a second channel region between a second source electrode and a second drain electrode in a second area corresponding to the second FET device, and selectively depositing a first gate stack for the first FET device, followed by selectively depositing a second gate stack for the second FET device.

The process of selectively depositing a first gate stack for the first FET device may include: depositing a first organic planarization layer on the second channel region of the second FET device; depositing a first ultrathin dielectric dipole layer in the first and second areas; depositing a first high-k (HK) insulating layer in the first and second areas; depositing a first doped gate metal layer in the first and second areas; and utilizing lift-off to etch (remove) the first organic planarization layer, the first ultrathin dielectric dipole layer, the first high-k (HK) insulating layer, and the first doped gate metal layer in the second area.

The process of selectively depositing a second gate stack for the second FET device may include: depositing a second organic planarization layer on the first FET device; depositing a second ultrathin dielectric dipole layer in the first and second areas; depositing a second high-k (HK) insulating layer in the first and second areas; depositing a second doped gate metal layer in the first and second areas; and utilizing lift-off to etch (remove) the second organic planarization layer, the second ultrathin dielectric dipole layer, the second high-k (HK) insulating layer, and the second doped gate metal layer in the first area.

For example, a gate stack may be deposited simultaneously or concurrently in all areas corresponding to FET devices within a given circuit. However, a lift-off technique can then be utilized to selectively mask all but one FET device at a time. For example, prior to gate stack deposition, the organic planarization layer (OPL) may be deposited in all areas (such as all areas corresponding to an FET device) except for the one device that is to be permanently deposited. The gate stacks that are deposited on the OPL may be of poor quality because the surface of the OPL is not optimized (e.g., suitable) for ALD. Accordingly, when the circuit substrate is exposed to an etchant, the etchant can easily penetrate the gate stack layers to reach the OPL underneath, thereby removing all four layers (e.g., the gate stack layers and the OPL). In contrast, the gate stack deposited on top of the channel region may be of high quality because the surface of the channel is optimized (e.g., suitable) for ALD, and such high quality gate stacks are not etched. The significant difference in the quality of the deposited stack and the interface in-between may thus enable selective removal of layers deposited over the OPL, e.g., in the lift-off manner.

The composition of the OPL may be the same as available in the related art. Additional details of the lift-off method, including etchant compositions, times, and other parameters, may be understood by those having ordinary skill in the art.

FIGS. 2A-2D are schematic diagrams showing selected deposition states generated during the deposition and removal of various layers in a process for manufacturing a 2 Vt (e.g., including two FET devices with differing Vt) CMOS circuit. The schematics of FIGS. 2A-2D are generalized to any type of device (e.g., nFET or pFET), and it will be understood that the compositions of the layers herein can be suitably selected as described above in order to yield a desired nFET or pFET configuration.

Figure 2A:
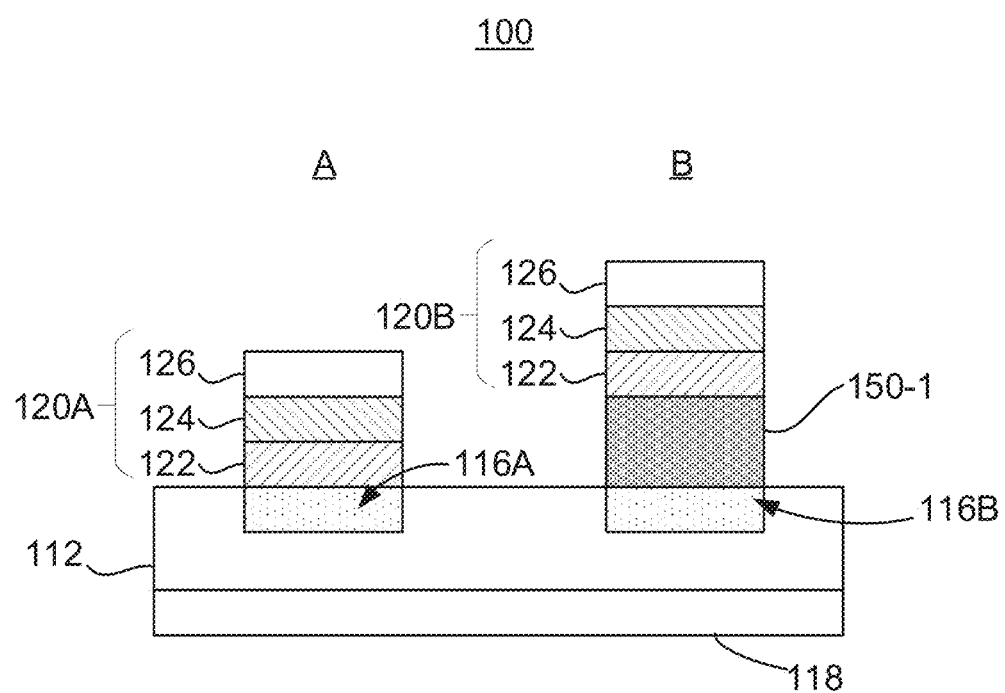
FIGS. 2A-2D are schematic diagrams showing selected deposition states in the process for manufacturing a CMOS circuit including two FET devices, according to embodiments of the present disclosure.

FIG. 2A depicts a state 100 in which a standard patterning scheme is applied to expose a targeted first device A while protecting a second device B with an organic planarization layer (OPL) 150-1. The first device A and the second device B respectively include channel regions 116A and 116B embedded in an semiconductor underlayer 112, which is deposited over a shared substrate 118. The first OPL 150-1 is deposited over channel region 116B (e.g., in the area for second device B). Subsequently, gate stacks 120A and 120B are simultaneously (concurrently) deposited over the areas for the first and second devices A and B, respectively. The gate stacks 120A and 120B include the ultrathin dielectric dipole layer 122, the HK insulating layer 124, and the doped gate metal layer 126 as described above.

In some embodiments, for example when the gate stack includes an ultrathin dielectric dipole layer including or formed of $LaSiO_x$ and a doped gate metal layer including or formed of p-doped TiN, the gate stack may be designed or optimized in a way to match the performance values of related art gate stacks, (e.g., a $SiO_x/HfO_2/TiN$ stack). The total thickness of the gate stack may be controlled, e.g. at ~2 nm to 4 nm for the ultrathin dielectric dipole layer/HK insulating layer pair, and ~1 nm to 3 nm for the doped gate metal layer.

Figure 2B:
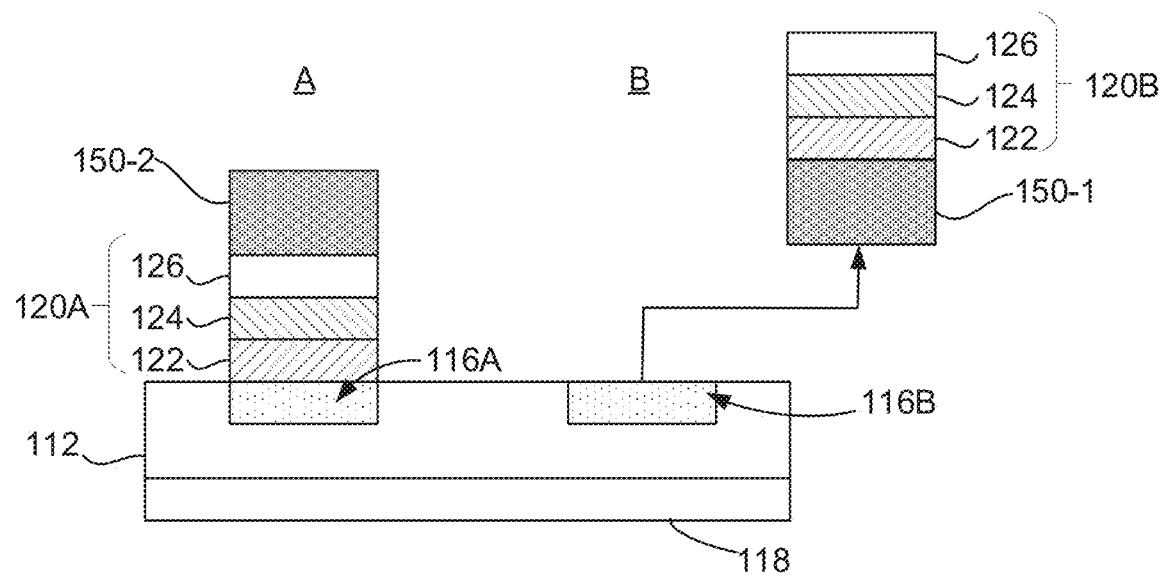

FIG. 2B depicts a subsequent state 200 in which the area for the second device B is cleared, and both devices are prepared for further deposition. In 200, a selective etch is applied to the circuit substrate 118. The gate stack 120A in the first device A is resistant to the etch because it is deposited directly on the channel region 116A, which is optimized or suitable for ALD. In contrast, the gate stack 120B is highly defective, and can be removed from the area for the second device B, along with the OPL 150-1 e.g., using the lift-off mechanism described above. Subsequently, a second OPL 150-2 is applied to the first device area A to expose only the second device B to patterning.

Figure 2C:
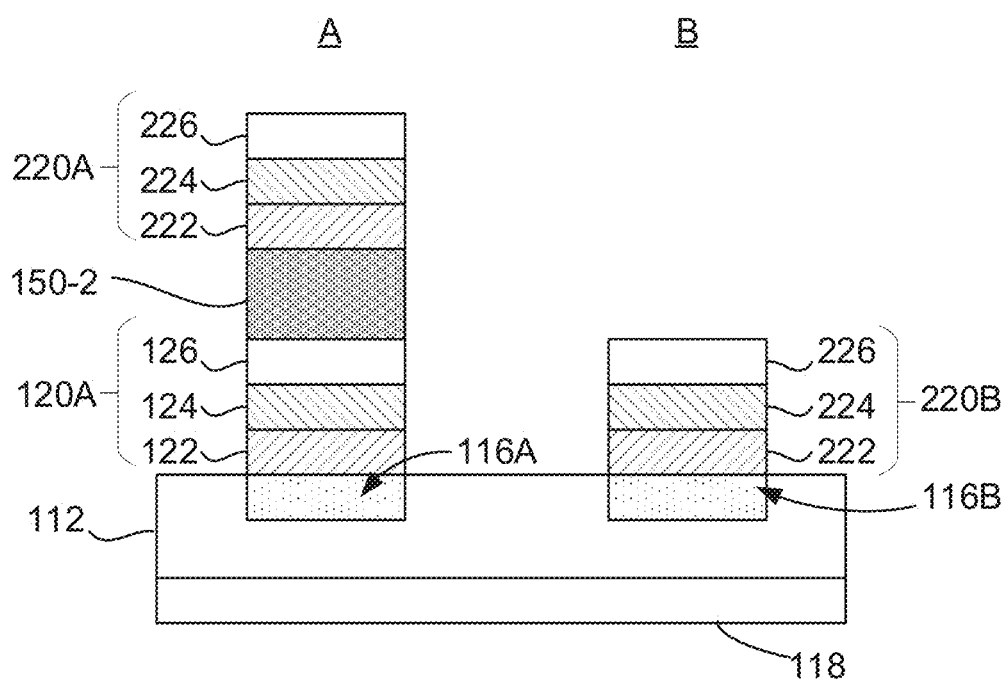

FIG. 2C depicts a subsequent state 300 in which the standard patterning scheme is again applied, this time to expose a targeted second device B while the first device A is protected with the second OPL 150-2. Second gate stacks 220A and 220B are simultaneously (concurrently) deposited over the areas for the first and second devices A and B. The gate stacks 220A and 220B include the ultrathin dielectric dipole layer 222, the HK insulating layer 224, and the doped gate metal layer 226, which are substantially the same as described above except for optional changes, which will be described below.

Figure 2D:
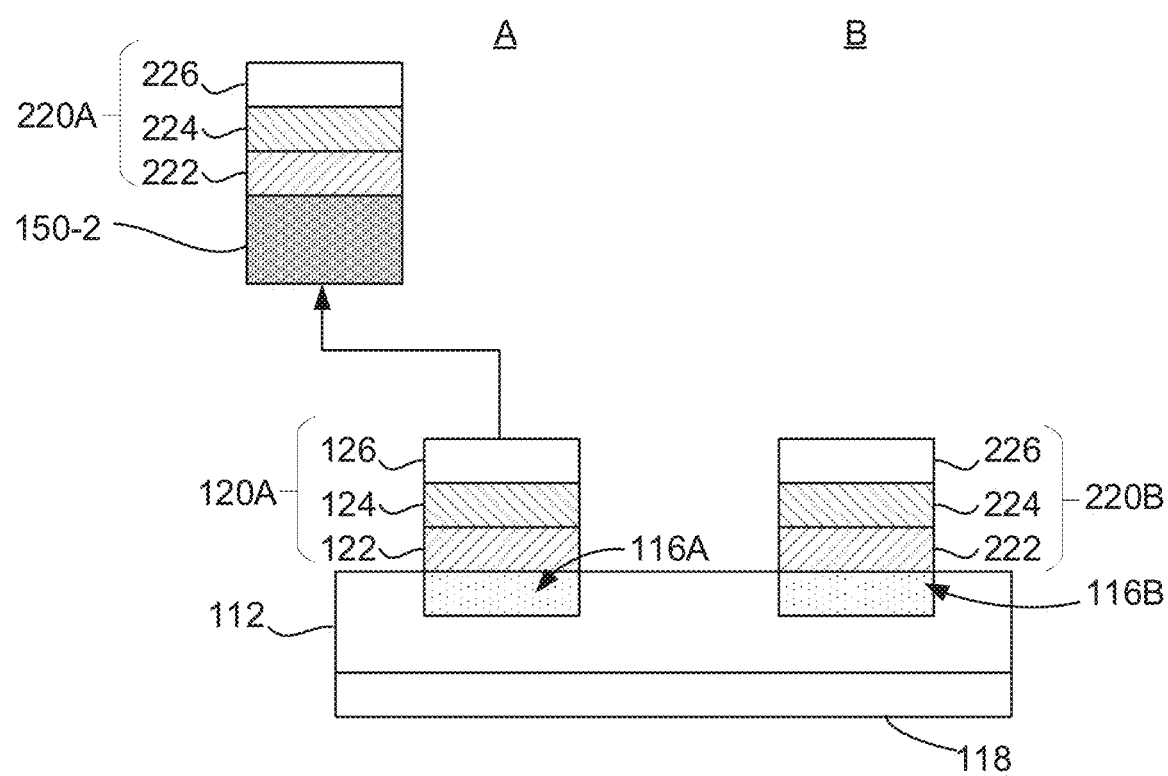

Finally, FIG. 2D depicts a subsequent state 400 in which the gate stack 220A over the first device A is cleared. In 400, the same selective etch is applied to the circuit substrate 118. This time, the gate stack 220B in the second device B is resistant to the etch because it is deposited directly on the channel region 116B, which is optimized for ALD. In contrast, the gate stack 220A is highly defective, and is removed from the area for the second device A, along with the OPL 150-2 using lift-off. Accordingly, a substrate including two completed FET devices is provided.

While embodiments have been described in which each layer of each gate stack is deposited by ALD, embodiments of the present disclosure are not limited thereto, and any suitable deposition method may be utilized as long as the gate stack layers can be easily removed from untargeted devices, e.g., using lift-off. When the layers are deposited by ALD, the deposition temperature may be selected in order to optimize or improve the quality of the gate stacks that are directly deposited on the channel regions, while maintaining ease of lift-off for the gate stacks that are deposited over OPLs. For example, the first ultrathin dielectric dipole and the second ultrathin dielectric dipole layer may each be deposited at a temperature of 100° C. to 500° C., and the first doped gate metal layer and the second doped gate metal layer may each be deposited at a temperature of 100° C. to 500° C. In some embodiments, the ALD deposition temperatures for all (each) of the layers may be 200° C. to 400° C., or 250° C. to 300° C.

In order for the first device A and the second device B to have different Vt values (shifts), the gate stacks 120A and 220B of the respective devices may have different compositions so that they are optimized or adjusted to distinct Vt values. Because the shift provided by the ultrathin dielectric dipole layer has a large magnitude of 200 mV to 400 mV, and because the voltage gap between devices is often smaller, it may be advantageous to vary the shift provided by the doped metal gate layer. The first doped gate metal layer and the second doped gate metal layer may each include doping amounts of 0 at % to 4 at % as described above, but the doping amounts in each device may be different from each other. For example, the doping amount of the doping metal gate layer 126 and the doping metal gate layer 226 may each independently be selected to be different values between 0 at % to 4 at % (e.g., 0.1 at % to 3 at %), such that the first and second devices have Vts that are separated by a desired voltage, or for example, meet their respective target Vt values.

In a first example, the first and second devices A and B may both be nFET devices, and the gate stacks of each may include an ultrathin dielectric dipole layer including or formed of $LaSiO_x$ and a doped gate metal layer including or formed of p-doped TiN, where the doped gate metal layers of the first and second devices A and B may include different doping amounts. In a second example, the first and second devices A and B may both be pFET devices, and the gate stacks of each may include an ultrathin dielectric dipole layer including or formed of AlO and a doped gate metal layer including or formed of n-doped TiN, where the doped gate metal layers of the first and second devices A and B may include different doping amounts. In both examples, the large negative (positive) Vt shift resulting from the dipole $LaSiO_x$ (AlO) may be partially compensated by the p-doped (n-doped) gate metal layer in slightly varying amounts between the two devices, in order to attain the designated Vt values.

While the above method and examples have been described with respect to a substrate or circuit including two FET devices, embodiments of the present disclosure are not limited thereto. The multi-Vt CMOS circuit may include any suitable number of devices, and for example, may be a 3 Vt device, a 4 Vt device, a 6 Vt device, etc.

In some embodiments, for example, when the substrate or circuit includes 3 or more Vt devices, one or more FET devices may not include (e.g., may exclude) an ultrathin dielectric dipole layer. For example, the RVT device may not include the ultrathin dielectric dipole layer. Accordingly, the Vt shift of that (those) device(s) may be further varied by virtue of providing the an ultrathin dielectric dipole layer-derived shift to some, but not all of the devices.

In a third example, first, second, and third devices A, B, and C may all be nFET devices, and the gate stacks of each may include a doped gate metal layer including p-doped TiN. Here, the gate stacks of the first and second devices A and B may each include an ultrathin dielectric dipole layer including or formed of $LaSiO_x$, while the gate stack of the third device C may not (e.g., does not). The doped gate metal layers of the first and second devices A and B may have different doping amounts, such that the first, second, and third devices have different Vts by virtue of their inclusion or exclusion of an ultrathin dielectric dipole layer and/or the amount of dopant in the doped gate metal layer. For example, the first device A may be referred to as a SLVT device having a Vt of −0.15 V, the second device B may be referred to as a LVT device having a Vt of 0.2 V, and the third device C may be referred to as a RVT device having a Vt of 0.25 V. However, embodiments of the present disclosure are not limited thereto, and different Vt combinations and values may be obtained by selecting suitable gate stacks and doped gate metal layer compositions and dopant amounts, etc.

In some embodiments, the ultrathin dielectric dipole layer may be designed (e.g., optimized) to provide the same amount of Vt shift in each device. In some embodiments, the ultrathin dielectric dipole layer may be designed (e.g., optimized) to provide different amounts of Vt shift to each device, for example, by changes in composition and/or thickness.

Figure 3:
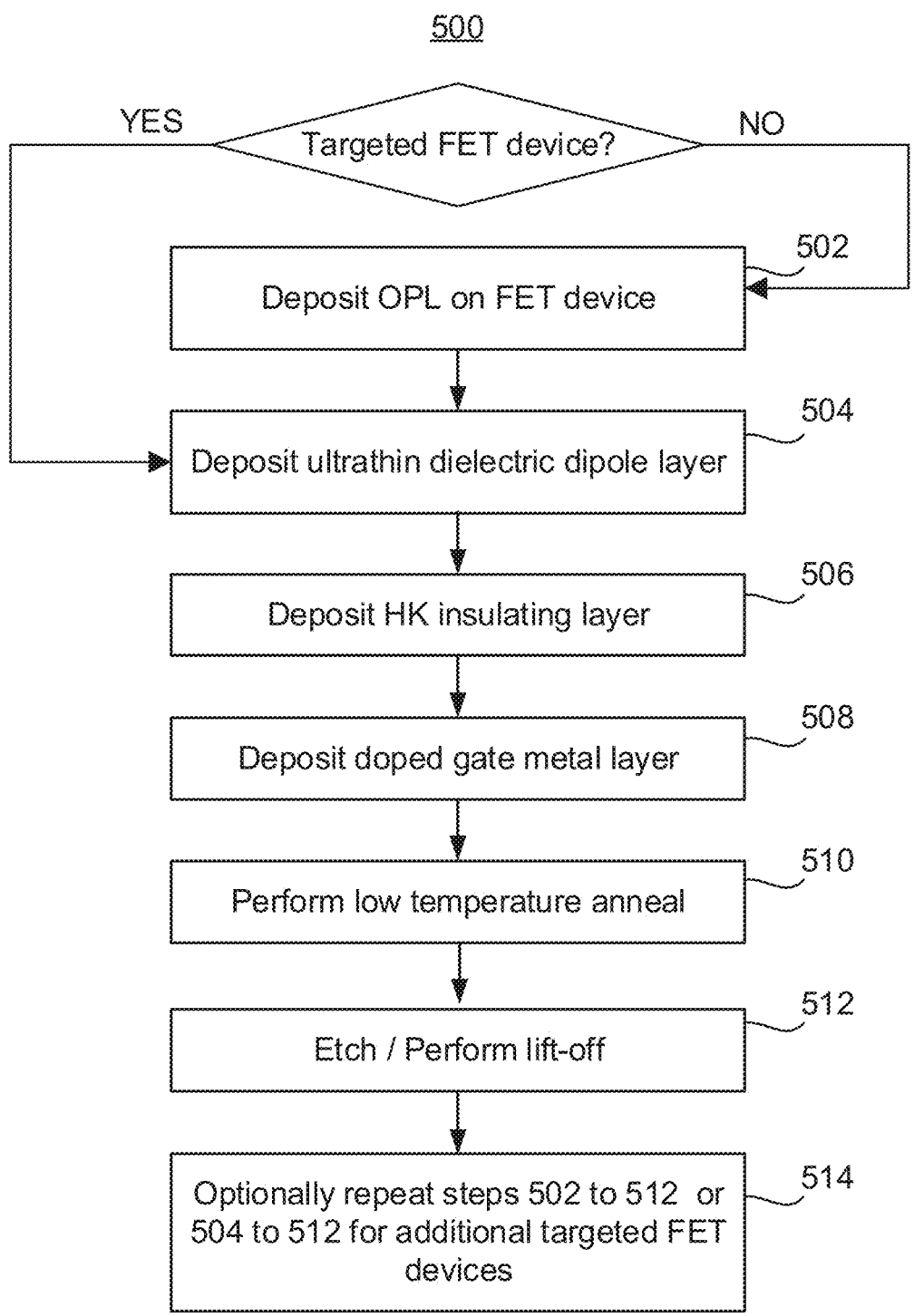
FIG. 3 is a flowchart depicting a process for manufacturing a FET device within a CMOS circuit, according to embodiments of the present disclosure.

FIG. 3 is a flowchart depicting a generalized process 500 for manufacturing a FET device within the CMOS circuit according to embodiments of the present disclosure. The first act of the process 500 is to determine whether the gate stack to be deposited on the FET device is the final, high-quality, intended gate stack, or if the gate stack will be removed (e.g., if the FET device is the targeted device for that cycle, or another device). If the gate stack will be removed (NO) and the FET device prepared in a later cycle, an OPL is deposited on the device (step 502). If the gate stack is the desired permanent gate stack (e.g., for the targeted device) (YES), the OPL is not deposited. Next, the gate stack is deposited through the acts of depositing the ultrathin dielectric dipole layer (step 504), depositing the HK insulating layer (step 506), and depositing the doped gate metal layer (step 508). A low temperature anneal is applied to the FET device (step 510). Next, a lift-off etch is performed (step 512) so that the gate stack is removed if an underlying OPL was deposited in step 502. The above steps are repeated in additional cycles to target different FET devices in turn (step 514). For example, the number of cycles may be equal to the number of devices.

In some embodiments, the lower temperature anneal of step 510 may be performed at a temperature of about 100° C. to 600° C., for example, about 200° C. to 500° C.

In some embodiments, because the annealing temperature is applied at low temperature, the ultrathin dielectric dipole layer cannot be driven through the HK insulating layer, and should be deposited before the HK insulating layer is deposited. This deposition order, including subsequent deposition of the doped metal gate layer, may in some embodiments be crucial to the formation of the described gate stack structure having the ability to provide fine-tuned control of Vt. In some embodiments, however, other deposition orders are possible, and deviations of the above-described method may be possible.

Although the foregoing has been described with reference to various embodiments of the present disclosure, it will be understood that various changes and modifications of the present disclosure may be made by one having ordinary skill in the art without departing from the spirit and technical field of the present disclosure, as set forth in the following claims and their equivalents.

What is claimed is:

1. A field-effect transistor (FET) device having a modulated threshold voltage (Vt), the FET device comprising:
   a source electrode;
   a drain electrode;
   a channel region extending between the source electrode and the drain electrode; and
   a gate stack on the channel region, the gate stack comprising:
      an ultrathin dielectric dipole layer on the channel region configured to shift the modulated Vt in a first direction;

a high-k (HK) insulating layer on the ultrathin dielectric dipole layer; and
a doped gate metal layer on the HK insulating layer configured to shift the modulated Vt in a second direction,
the gate stack having an RMG spacing of 10 nm or less, wherein the modulated Vt shift is in one or more increments of 50 mV to 150 mV.

2. The FET device of claim 1, wherein the second direction is opposite the first direction.

3. The FET device of claim 1, wherein the second direction is the same as the first direction.

4. The FET device of claim 1, wherein:
the ultrathin dielectric dipole layer comprises at least one of $Lu_2O_3$, $LuSiO_x$, $Y_2O_3$, MgO, $MgSiO_x$, $YSiO_x$, $La_2O_3$, $LaSiO_x$, BaO, $BaSiO_x$, SrO, $SrSiO_x$, or a combination thereof; and
(i) the FET device is an nFET device, and the first direction is a downward voltage level direction, or
(ii) the FET device is a pFET device, and the first direction is an upward voltage level direction.

5. The FET device of claim 1, wherein:
the ultrathin dielectric dipole layer comprises at least one of $Al_2O_3$, $AlSiO_x$, $TiO_2$, $TiSiO_x$, $HfO_2$, $HfSiO_x$, $ZrO_2$, $ZrSiO_x$, $TaO_2$, $TaSiO_x$, ScO, $ScSiO_x$, or a combination thereof; and
(i) the FET device is an nFET device, and the first direction is an upward voltage level direction, or
(ii) the FET device is a pFET device, and the first direction is a downward voltage level direction.

6. The FET device of claim 1, wherein the doped gate metal layer comprises at least one of Al-doped TiN, Al-doped TaN, Zr-doped TiN, Zr-doped TaN, Hf-doped TiN, Hf-doped TaN, or a combination thereof; and
(i) the FET device is an nFET device, and the first direction is a downward voltage level direction, or
(ii) the FET device is a pFET device, and the first direction is an upward voltage level direction.

7. The FET device of claim 1, wherein the doped gate metal layer comprises at least one of Si-doped TiN, Si-doped TaN, LaO-doped TiN, LaO-doped TaN, SiO-doped TiN, SiO-doped TaN, ZrO-doped TiN, ZrO doped TaN, lanthanide metal-doped TiN, La-doped TaN, or a combination thereof; and
(i) the FET device is an nFET device, and the first direction is an upward voltage level direction, or
(ii) the FET device is a pFET device, and the first direction is a downward voltage level direction.

8. The FET device of claim 1, wherein the doped gate metal layer has a doping amount of greater than 0 at % to 4 at %.

9. The FET device of claim 1, wherein the doped gate metal layer has a thickness of 1 nm to 5 nm.

10. The FET device of claim 1, wherein the channel region comprises silicon (Si), silicon-germanium (SiGe), or SiGe; and an overlying layer of naturally formed $SiO_x$.

11. The FET device of claim 1, wherein the channel region is on a silicon (Si), silicon on insulator (SOI), strain-SOI (sSOI), silicon-germanium on insulator (SGOI), or strain-SGOI (sSGOI) substrate; and
the substrate and/or the channel region has a crystal orientation of (110), (111), or (100).

12. The FET device of claim 1, wherein:
the channel region comprises a plurality of nanosheets having a vertical spacing (VSP) therebetween of 5 nm to 15 nm, the nanosheets being interposed by an interfacial layer (IL) oxide and the gate stack.

13. The FET device of claim 1, wherein the ultrathin dielectric dipole layer has a thickness of less than 1 nm after annealing.

14. A CMOS circuit comprising a first FET device and a second FET device, wherein:
the first FET device and the second FET device are each the FET device of claim 1, and
the first FET device is an nFET device and the second FET device is a pFET device.

15. The CMOS circuit of claim 14, wherein the nFET device and the pFET device are each independently selected from a high Vt (HVT) device, a regular Vt (RVT) device, a low Vt (LVT) device, and a super low Vt (SLVT) device,
the HVT device and the RVT device being different in voltage by 50 mV to 100 mV, the RVT device and the LVT device being different in voltage by 50 mV to 100 mV, and the LVT device and the SLVT device being different in voltage by 50 mV to 100 mV.

16. The CMOS circuit of claim 15, wherein the HVT device and the RVT device are different in voltage by 60 mV to 80 mV, the RVT device and the LVT device are different in voltage by 60 mV to 80 mV, and the LVT device and the SLVT device are different in voltage by 60 mV to 80 mV.

17. A method of manufacturing a CMOS circuit, the method comprising:
providing a first channel region between a first source electrode and a first drain electrode in a first area corresponding to a first FET device,
providing a second channel region between a second source electrode and a second drain electrode in a second area corresponding to the second FET device;
selectively depositing a first gate stack for the first FET device by:
depositing a first organic planarization layer on the second channel region of the second FET device;
depositing a first ultrathin dielectric dipole layer in the first and second areas;
depositing a first high-k (HK) insulating layer in the first and second areas;
depositing a first doped gate metal layer in the first and second areas;
annealing the first gate stack; and
utilizing lift-off to etch the first organic planarization layer, the first ultrathin dielectric dipole layer, the first high-k (HK) insulating layer, and the first doped gate metal layer in the second area; and
selectively depositing a second gate stack for the second FET device by:
depositing a second organic planarization layer on the first FET device;
depositing a second ultrathin dielectric dipole layer in the first and second areas;
depositing a second high-k (HK) insulating layer in the first and second areas;
depositing a second doped gate metal layer in the first and second areas;
annealing the second gate stack; and
utilizing lift-off to etch the second organic planarization layer, the second ultrathin dielectric dipole layer, the second high-k (HK) insulating layer, and the second doped gate metal layer in the first area,
the first and second gate stacks each having an RMG spacing of 10 nm or less and a modulated threshold voltage (Vt) shifted in one or more increments of 50 mV to 150 mV.

18. The method of claim 17, wherein the first ultrathin dielectric dipole layer and the second ultrathin dielectric dipole layer are each deposited via atomic layer deposition (ALD) at a temperature of 100° C. to 500° C.

19. The method of claim 17, wherein the first doped gate metal layer and the second doped gate metal layer are each deposited via atomic layer deposition (ALD) at a temperature of 100° C. to 500° C.

20. The method of claim 17, wherein the first doped gate metal layer and the second doped gate metal layer each comprise doping amounts of 0 at % to 4 at %, the amounts being different from each other.

* * * * *